United States Patent
Brown

(10) Patent No.: US 8,139,055 B2
(45) Date of Patent: Mar. 20, 2012

(54) COMBINED IMAGE SENSOR AND DISPLAY DEVICE

(75) Inventor: Christopher James Brown, Lockerbie (GB)

(73) Assignee: Sharp Kabushiki Kaisha, Osaka (JP)

( * ) Notice: Subject to any disclaimer, the term of this patent is extended or adjusted under 35 U.S.C. 154(b) by 655 days.

(21) Appl. No.: 12/303,794

(22) PCT Filed: Jun. 11, 2007

(86) PCT No.: PCT/JP2007/062186
§ 371 (c)(1),
(2), (4) Date: Dec. 8, 2008

(87) PCT Pub. No.: WO2007/145347
PCT Pub. Date: Dec. 21, 2007

(65) Prior Publication Data
US 2010/0231562 A1    Sep. 16, 2010

(30) Foreign Application Priority Data
Jun. 12, 2006 (GB) .................................. 0611536.4

(51) Int. Cl.
G06F 3/038 (2006.01)
G09G 5/00 (2006.01)
H04N 9/04 (2006.01)
(52) U.S. Cl. ..................... 345/207; 345/212; 348/207.99
(58) Field of Classification Search ............... 250/208.1, 250/214.1, 205, 370.09; 341/158, 143; 345/214, 345/207, 76, 81, 89, 102, 212; 348/308, 348/362, 207.99, 226.1, 222.1, 294; 600/301; 330/4.9; 257/291, 204, 72, 294; 313/506; 326/81; 382/124; 435/5
See application file for complete search history.

(56) References Cited

U.S. PATENT DOCUMENTS

| | | | |
|---|---|---|---|
| 4,746,804 A | 5/1988 | Kitamura et al. | |
| 4,797,546 A | 1/1989 | Berger et al. | |
| 5,043,785 A | 8/1991 | Mizutani et al. | |
| 5,376,782 A | 12/1994 | Ikeda et al. | |
| 5,471,515 A | 11/1995 | Fossum et al. | |
| 5,705,807 A | 1/1998 | Throngnumchai et al. | |
| 5,719,626 A | 2/1998 | Yoneyama et al. | |
| 5,942,774 A | 8/1999 | Isogai et al. | |

(Continued)

FOREIGN PATENT DOCUMENTS
EP    0 490 683    6/1992
(Continued)

OTHER PUBLICATIONS
Co-pending U.S. Appl. No. 12/303,567, filed on Dec. 5, 2008.
(Continued)

*Primary Examiner* — Quan-Zhen Wang
*Assistant Examiner* — Lin Li
(74) *Attorney, Agent, or Firm* — Renner, Otto, Boisselle & Sklar, LLP

(57) ABSTRACT

A combined image sensor and display device comprises an array of device elements (18), each of which comprises a display pixel (M4, C2, CLC). The display pixels have data inputs connected to column data lines (SL, 6,6'). The array includes sensor elements (10), each comprising a transistor (M1), an integrating capacitor (C1) and a photodiode (D1) connected together to an integrating node (11). The transistor (M1) is connected between column data lines (6,6'). The capacitor (C1) is connected to a control input (RS) which receives a first voltage during a sensing phase for switching off the transistor (M1) and a second voltage during a reading phase for enabling the transistor (M1).

27 Claims, 13 Drawing Sheets

U.S. PATENT DOCUMENTS

| | | | |
|---|---|---|---|
| 6,163,023 | A | 12/2000 | Watanabe |
| 6,384,413 | B1 | 5/2002 | Pain |
| 6,489,631 | B2 | 12/2002 | Young et al. |
| 7,211,880 | B2 | 5/2007 | Izumi |
| 7,242,145 | B2 * | 7/2007 | Young .................. 315/169.3 |
| 7,242,449 | B1 | 7/2007 | Yamazaki et al. |
| 7,329,848 | B2 | 2/2008 | Shin |
| 7,453,424 | B2 | 11/2008 | Johnson et al. |
| 7,663,080 | B2 | 2/2010 | Tsai |
| 7,773,068 | B2 | 8/2010 | Nakamura et al. |
| 7,773,078 | B2 | 8/2010 | Lee et al. |
| 2002/0139981 | A1 * | 10/2002 | Young ....................... 257/72 |
| 2003/0011694 | A1 | 1/2003 | Dierickx |
| 2003/0080340 | A1 * | 5/2003 | Henderson et al. ........... 257/72 |
| 2003/0164441 | A1 * | 9/2003 | Lyon et al. ............. 250/208.1 |
| 2004/0008172 | A1 | 1/2004 | Nakamura et al. |
| 2004/0191687 | A1 | 9/2004 | Fukuzawa et al. |
| 2005/0104877 | A1 | 5/2005 | Nakamura et al. |
| 2005/0116937 | A1 | 6/2005 | Choi et al. |
| 2005/0212916 | A1 * | 9/2005 | Nakamura et al. ....... 348/207.99 |
| 2005/0280713 | A1 * | 12/2005 | Hagihara et al. ........ 348/207.99 |
| 2006/0011913 | A1 | 1/2006 | Yamazaki |
| 2006/0033729 | A1 | 2/2006 | Yoshida et al. |
| 2006/0192766 | A1 | 8/2006 | Nakamura et al. |
| 2007/0109286 | A1 | 5/2007 | Nakamura et al. |
| 2008/0129653 | A1 | 6/2008 | Yamazaki |

FOREIGN PATENT DOCUMENTS

| | | | |
|---|---|---|---|
| EP | 1 085 751 | A2 | 3/2001 |
| GB | 2 332 049 | | 6/1999 |
| JP | 64-050460 | A | 2/1989 |
| JP | 05-276442 | A | 10/1993 |
| JP | 8-122149 | A | 5/1996 |
| JP | 09-247536 | | 9/1997 |
| JP | 10-093066 | | 4/1998 |
| JP | 10-093070 | | 4/1998 |
| JP | 11-177886 | A | 7/1999 |
| JP | 11-177996 | A | 7/1999 |
| JP | 2001-109394 | A | 4/2001 |
| JP | 2002-314756 | A | 10/2002 |
| JP | 2004-45879 | A | 2/2004 |
| JP | 2004-318067 | | 11/2004 |
| JP | 2004-319067 | A | 11/2004 |
| JP | 2004-325961 | | 11/2004 |
| KR | 10-2005-0052674 | A | 6/2005 |

OTHER PUBLICATIONS

European Search Report for corresponding Application No. 07745440.3 dated Jul. 6, 2009.

Tada et al.; "A Touch Panel Function Integrated LCD Using LTPS Technology"; IDW. Proceedings of the International Display Workshops, Jan. 1, 2004, pp. 349-350; XP003000288.

Gruev et al.; "Two Transistor Current Mode Active Pixel Sensor"; Circuits and Systems IEEE International Symposium, May 1, 2007, pp. 2846-2849.

International Search Report for corresponding Application No. PCT/JP2007/062186 mailed Sep. 25, 2007.

British Search Report for corresponding Application No. GB0611536.4 dated Oct. 19, 2006.

E. Fossum et al., "128x128 CMOS photodiode-type active pixel sensor with on-chip timing, control, and signal chain electronics", Charged-Coupled Devices and Solid-State Optical Sensors V, Proc. SPIE vol. 2415, pp. 117-123, 1995).

Chris Brown et al., "ISSCC2007/Session 7/Display Electronics/7.2", 2007 IEEE International Solid-State Circuits Conference, Feb. 12, 2007, pp. 132-133 and 592).

Office Action for co-pending related U.S. Appl. No. 12/303,567 mailed Jun. 22, 2011.

International Search Report for International Application No. PCT/JP2007/062184 mailed Sep. 18, 2007.

British Search Report for UK Application No. GB0611537.2 dated Sep. 25, 2006.

EP Search Report for European Application No. 07745438.7 dated Jul. 6, 2009.

Office Action for co-pending related U.S. Appl. No. 12/303,567 dated Dec. 14, 2011.

* cited by examiner

RST:

RS:

RST:

RS:

COMBINED IMAGE SENSOR AND DISPLAY DEVICE

TECHNICAL FIELD

The present invention relates to a combined image sensor and display device.

BACKGROUND ART

There is a desire to fabricate an image sensor in a thin-film polysilicon process which is compatible with that used in the manufacture of thin-film transistor substrates for active matrix liquid crystal displays (AMLCDs). By using such a fabrication process, such an image sensor may be monolithically integrated within an AMLCD in order to provide, for example, an input function for detecting a touch or pen input. In such an arrangement, each pixel may include both image sensing and displaying elements to provide similar spatial resolutions of image sensing and display. However, the presence of the image sensing function within the pixels reduces the aperture ratio of such a display as compared with a display in which no image sensing function is provided.

Several types of semiconductor image sensors exist, including those based on charge-coupled device (CCD) technology and those based on complementary metal oxide silicon (CMOS) technology. CCDs have historically offered higher quality performance than CMOS image sensors because of the specialized process technologies for maximizing the transfer efficiency of photo-generated charges. However, CMOS image sensors have an advantage in that both an imaging array and signal processing electronics may be integrated onto the same chip whereas the specialized nature of CCD processes prohibits such integration. CMOS image sensors therefore have advantages of lower cost for many applications, for example in consumer electronics.

Two main types of CMOS image sensors are known, namely passive pixel sensors (PPS) and active pixel sensors (APS). Passive pixel sensors include a photodiode or similar photo sensitive device and a "select" transistor within each pixel of the image sensor. An image sensor array is addressed by row and the current generated by each photodiode is integrated for the duration of one row period by an integrator located typically at the bottom of each column. Because each pixel contains only two active devices, passive pixel arrangements permit a high resolution array to be provided. However, the size of such an array is limited by the time needed to integrate each row sequentially and the output signals suffer from a relatively large degree of noise associated with fluctuations in the column current during integration.

APS devices include an amplifier in each pixel and so do not suffer from the limitations of PPS arrangements. FIG. 1 of the accompanying drawings illustrates an example of an APS with a photogate-based pixel circuit, for example as disclosed in U.S. Pat. No. 5,471,515. In operation, during an integration period, electrons accumulate in a potential well beneath a photogate 30 in proportion to a photon flux incident on a substrate beneath the photogate electrode. At the end of each integration period, the potential of a floating diffusion region 40 is reset to an initial level by applying a resetting signal pulse RST. The charge accumulated on the photogate is then transferred to the floating diffusion region 40 during a transfer step controlled by a pulse TX. The potential of the floating diffusion region 40 is thus indicative of the charge accumulated during the integration period.

When a row of pixels is sampled, a row select transistor 60 is turned on by a row scan pulse (ROW). A transistor 55 is connected as a source-follower cooperating with a bias transistor 65 disposed at the end of a column of the pixel array. The gate of the transistor 55 is connected to a floating diffusion node so that the output of the source-follower provides an indication of the voltage at the gate of the transistor 55 and hence of the charge accumulated in the pixel during the integration period.

The image sensor chip also comprises circuitry for reading out the sampled pixel signal as illustrated at 70 in FIG. 1. When the row containing the sensing element is selected, the source follower output voltage representing the incident light intensity is stored in a capacitor 205 via a transistor 200. Transistors 210, 215 and 220 form another source-follower for the column containing the sensing element. When the column select signal COL is pulsed, the output of the column source-follower is supplied to a chip amplifier via an output OUT. The column source-followers are enabled in turn so that the image sensor output voltage is a time-sequential representation of the light intensity incident on each pixel of the array.

The arrangement shown in FIG. 1 also comprises devices 116, 225, 230, 235, 240 and 245 which are used to generate a reference voltage for the chip amplifier for reducing offset errors. The operation of such an arrangement is known and will not be described further.

FIG. 2 of the accompanying drawings illustrates a sensor element of the APS type including a photodiode 1 of the "bulk" or vertical type, for example as disclosed in "128×128 CMOS photodiode-type active pixel sensor with on-chip timing, control, and signal chain electronics", E Fossum et al, Charge-Coupled Devices and Solid-State Optical Sensors V, Proc. SPIE, Vol 2415, pp 117-123, 1995. The sensing element comprises a resetting transistor 2 connected between a supply line VDD and the cathode 3 of the photodiode 1. The gate of the transistor 2 receives a reset signal RST and reverse-biases the photodiode 1 so as to charge its capacitance to a predetermined voltage. The reset phase is followed by a sensing phase during which integration is performed whereby the photodiode current discharges its capacitance at a rate proportional to the photon flux incident on the photodiode 1. A transistor 4 is connected as a source-follower with its source-drain or "main conduction" path connected in series with that of a selecting transistor 5 between the supply line VDD and a column buss COL BUS of a sensing element array. When a row of pixels is sampled, the row select transistor 5 is turned on by a pulse RS. The column bus is connected to a column reading arrangement, for example of the type illustrated by the transistor 65 and the circuit 70 in FIG. 1, to allow the output voltages from the row of pixels to be read out of the sensor.

US 2006/0033729 A1 discloses a device comprising an image sensor integrated within an AMLCD as illustrated in FIG. 3 of the accompanying drawings. Each pixel comprises a display portion and an image sensing portion with the latter being of a type similar to that shown in FIG. 2 of the accompanying drawings. In this device, each photodiode comprises a thin-film photodiode fabricated using the same process technology as used for manufacture of the AMLCD thin-film transistor (TFT) substrate. A separate integration capacitor is required in this case because the ratio of the photocurrent to self-capacitance of the thin-film photodiode is large compared to that for a bulk CMOS device. Thus, in the absence of the integration capacitance, the pixel discharge rate would be too high for practical use.

Such a device may be operated in shadow mode or reflection mode. In shadow mode, objects above the AMLCD block the path of ambient light and cast a shadow on the surface of the display, which shadow is detected by the image sensor array. This mode may be used, for example, for touch, pen or gesture input. In reflection mode as illustrated in FIG. 4 of the accompanying drawings, light from a display backlight 23 passes through a counter-substrate 24, a liquid crystal layer 25 and a TFT substrate 21 so as to be incident on an object 22 in front of the device. Light reflected from the object 22 returns to the image sensor array for conversion into a corresponding signal. Examples of applications for the reflection mode include contact-type image scanning and fingerprint recognition and identification.

DISCLOSURE OF INVENTION

According to the invention, there is provided a combined image sensor and display device comprising a plurality of device elements arranged as an array of rows and columns, each of a first set of the device elements comprising a display pixel having a data input, the data inputs of each column being connected to a respective column data line, each of a second set of the device elements comprising an image sensor element comprising a photodetecting element, a semiconductor amplifying element, and an integrating capacitor having a first electrode, which is connected to a control electrode of the amplifying element and a first electrode of the photodetecting element, and a second electrode connected to a control input, which is arranged to receive, during a sensing phase, a first voltage for disabling the amplifying element and for permitting integration by the capacitor of a photocurrent from the photodetecting element and to receive, during a reading phase, a second voltage for enabling the amplifying element, each of the amplifying elements having a main conduction path connected to at least one of the column data lines, each of the amplifying elements having a control electrode threshold absolute voltage below which the amplifying element is disabled and the photocurrent being such that the absolute value of the voltage at the control electrode remains below the threshold absolute voltage during the sensing phase.

The polarity of the photocurrent may be such as to reduce the absolute value of the voltage at the control electrode during the sensing phase.

It is thus possible to provide a device having an improved display aperture ratio while combining the functions of a display and an image sensor. A greater portion of the device area may be used for display purposes, for example to provide a brighter display of improved appearance. Such a device may be manufactured using thin-film semiconductor process or silicon-on-insulator process technology.

The main conduction path of each of the amplifying elements may be connected between a pair of the column data lines.

The first set may comprise all of the device elements.

The second set may comprise fewer than all of the device elements.

Each of the sensor elements may be distributed across a respective group of the device elements.

The sensing and reading phases may be repeated.

Each of the photodetecting elements may be a photodiode. Each of the photodiodes may be a lateral photodiode. Each of the photodiodes may be a thin film diode.

Each of the amplifying elements may comprise a voltage-follower arrangement.

Each of the amplifying elements may comprise a first transistor. Each of the first transistors may be a thin film transistor. Each of the first transistors may be a field effect transistor. Each of the first transistors may be connected as a source-follower, the control electrode may comprise the transistor gate and the main conduction path may comprise the source-drain path.

Each of the sensor elements may comprise a semiconductor resetting element having a control electrode connected to a reset input and being arranged, during a resetting phase, to charge the capacitor to a predetermined voltage. Each of the resetting elements may have a main conduction path connected between the first electrode of the capacitor and a predetermined voltage source. Each of the resetting elements may comprise a second transistor. Each of the second transistors may be a thin film transistor.

The device may comprise row control inputs, each of which is connected to the control inputs of the sensor elements of a respective row. The device may comprise row reset inputs, each of which is connected to the reset inputs of the sensor elements of a respective row. Each of at least some of the column data lines may be connected to a respective biasing element. Each biasing element may comprise a third transistor. Each third transistor may be a thin film transistor.

The device may comprise an active matrix addressing arrangement.

The display pixels may be liquid crystal pixels.

The active matrix addressing arrangement may be arranged to address each row of the sensor elements during a line blanking period of a corresponding row of the display pixels.

BRIEF DESCRIPTION OF DRAWINGS

Like reference numerals refer to like parts throughout the drawings.

BEST MODE FOR CARRYING OUT THE INVENTION

Figure 5:
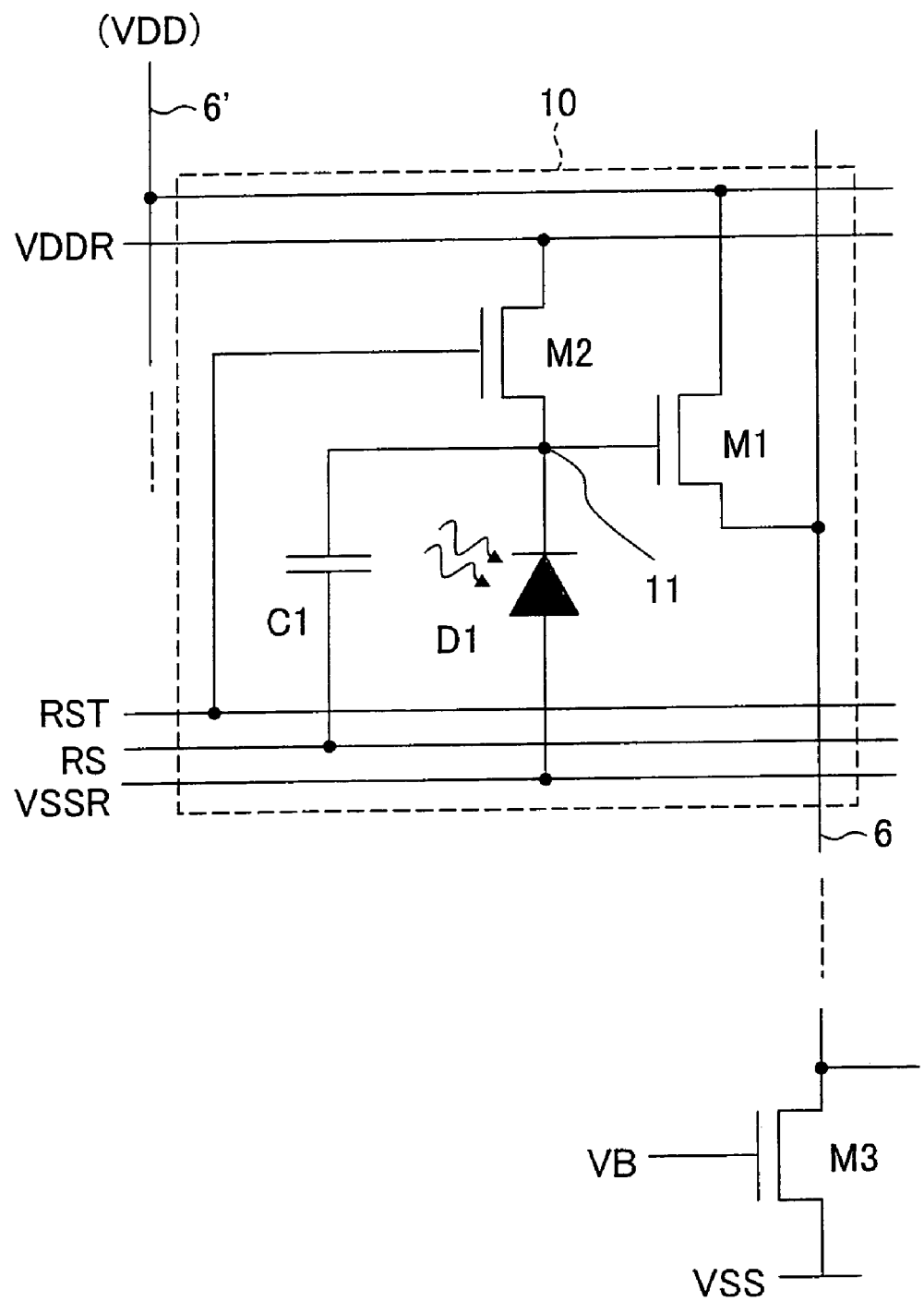
FIG. 5 is a circuit diagram of part of an image sensor for use in an embodiment of the invention.

A combined image sensor and display device comprises an array of rows and columns of sensor elements, each of which is as illustrated at 10 in FIG. 5. The sensor elements 10 together with addressing and output circuits are integrated on a common substrate, for example using thin-film transistor or silicon-on-insulator techniques. The sensor comprises an active matrix device, which is combined with an active matrix display of the liquid crystal type as described hereinafter.

The sensor element 10 comprises a photodetecting element embodied as a lateral thin-film photodiode D1, whose anode is connected to a line VSSR common to all the sensor elements of the row and carrying a photodiode anode potential $V_{SSR}$. The cathode of the photodiode is connected to an integrating node 11, which is connected to the first electrode or plate of an integrating capacitor C1. The second electrode or plate of the capacitor C1 is connected to a row select line RS, which is common to the sensor elements of the row and supplies a row select signal for selecting the row of sensor elements 10 during a reading phase.

The integrating node 11 is also connected to the gate of a semiconductor amplifying element embodied as a transistor M1 and to the source of a semiconductor resetting element embodied as a transistor M2 for performing resetting. The transistors M1 and M2 are thin-film insulated gate field effect transistors. The source of the transistor M1 is connected to a column data line 6. The line 6 is common to all of the sensor elements of the column and is connected, at its lower end, to the column output and to the drain of a thin film insulated gate field effect transistor M3. The transistor M3 acts as a bias arrangement forming a source load for the transistor M1 and has a source connected to another power supply line VSS and a gate connected to a reference voltage source supplying a reference voltage VB.

The drain of the transistor M1 is connected to the column data line 6' of the adjacent column of device elements, which comprise display pixels but not sensor elements. During a reading phase of the sensor element 10, the column data line is connected to a supply line VDD and the column data line 6 acts as a column output line. Outside the reading phase, the column data lines 6, 6' supply pixel data to display pixels of the device.

The drain of the transistor M2 is connected to a line VDDR, which is common to all of the sensor elements 10 and which supplies an initial reset potential $V_{DDR}$. The gate of the transistor M2 is connected to a reset line RST, which is common to the sensor elements 10 of the row and which supplies a reset signal during a resetting phase.

During image sensing, the sensor elements 10 perform a repeating cycle comprising a resetting phase, an integrating phase and a reading phase. The cycles for the sensor elements in the same row are in synchronism with each other whereas the cycles for different rows are staggered in time in accordance with known active matrix addressing techniques. During the resetting phase, a resetting pulse is supplied to the reset line RST as illustrated by the upper waveform in FIG. 6. The resetting pulse causes the transistor M2 to conduct while the pulse is at its high level so that the integrating node 11 and, in particular, the first electrode of the capacitor C1 are charged to an initial reset potential VDDR. The initial reset potential is less than the threshold of the transistor M1, which thus remains switched off during the resetting phase and the subsequent integrating phase.

The integrating phase begins when the resetting signal returns to its low value. The low value of the resetting signal is less than or equal to the photodiode anode potential $V_{SSR}$ so that the transistor M2 remains off throughout the integrating phase.

During the integrating phase, the photocurrent supplied by the photodiode D1 discharges the capacitor C1 at a rate proportional to the photon flux which is incident on the photodiode. At the end of the integrating phase, the voltage $V_{INT}$ of the integrating node is given by:

$$V_{INT}=V_{DDR}-I_{PHOTO}\cdot t_{INT}/C_T$$

where $I_{PHOTO}$ is the current through the photodiode D1, $t_{INT}$ is the integration time period and $C_T$ is the total capacitance at the integrating node. The total capacitance at the integrating node is given by the sum of the capacitance of the integrating capacitor C1, the self-capacitance of the photodiode D1, the gate capacitance of the transistor M1 and the gate-source capacitance of the transistor M2. The voltage at the integrating node 11, and hence at the gate of the transistor M1, thus falls further below the threshold voltage of the transistor M1. There is therefore no risk of the transistor M1 being accidentally turned on and starting to conduct.

Figure 6:
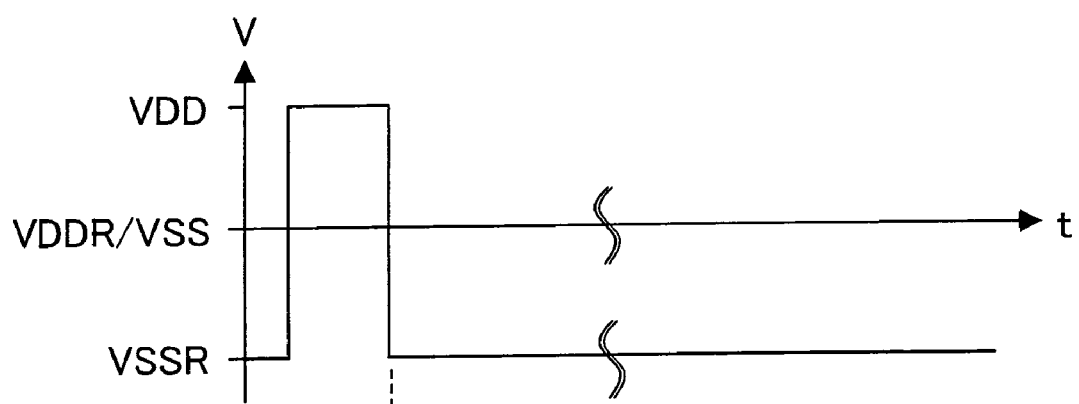
FIG. 6 is a timing diagram illustrating waveforms occurring in the sensor shown in FIG. 5.
Figure 6:
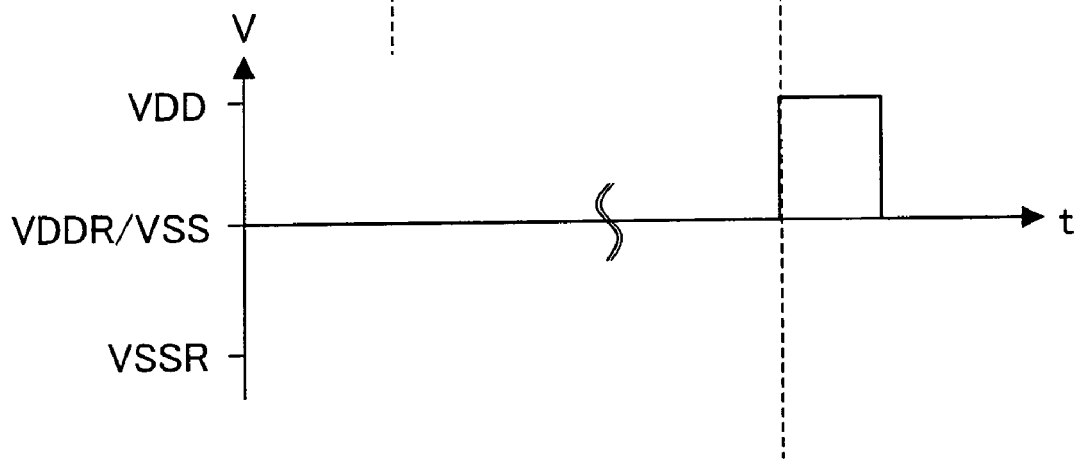

The integrating phase ends when the row select signal changes to its high level as illustrated by the lower waveform in FIG. 6. This starts the reading phase for all of the sensor elements 10 of the row. During the reading phase, the column data line receives a supply voltage $V_{DD}$ from the supply line VDD. Charge injection occurs across the integrating capacitor C1 such that the potential at the integrating node 11 is increased to:

$$V_{INT}=V_{DDR}-I_{PHOTO}\cdot t_{INT}/C_T+(V_{RS.H}-V_{RS.L})\cdot C_{INT}/C_T$$

where $V_{RS.H}$ and $V_{RS.L}$ are the high and low potentials, respectively, of the row select signal and may be equal to $V_{DD}$ and $V_{SS}$, respectively. The integrating node 11 is thus raised above the threshold voltage of the transistor M1, which is switched on and forms a source-follower amplifier with the transistor M3 to provide an output voltage at the column output indicative of the photodiode current integrated during the integrating phase and thus representing the light intensity incident on the photodiode D1.

At the end of the reading phase, the row select signal returns to its low potential and charge is removed from the integrating node 11 by injection across the integrating capacitor C1. The potential at the integrating node drops below the threshold voltage of the transistor M1, which is thus turned off.

Figure 1:
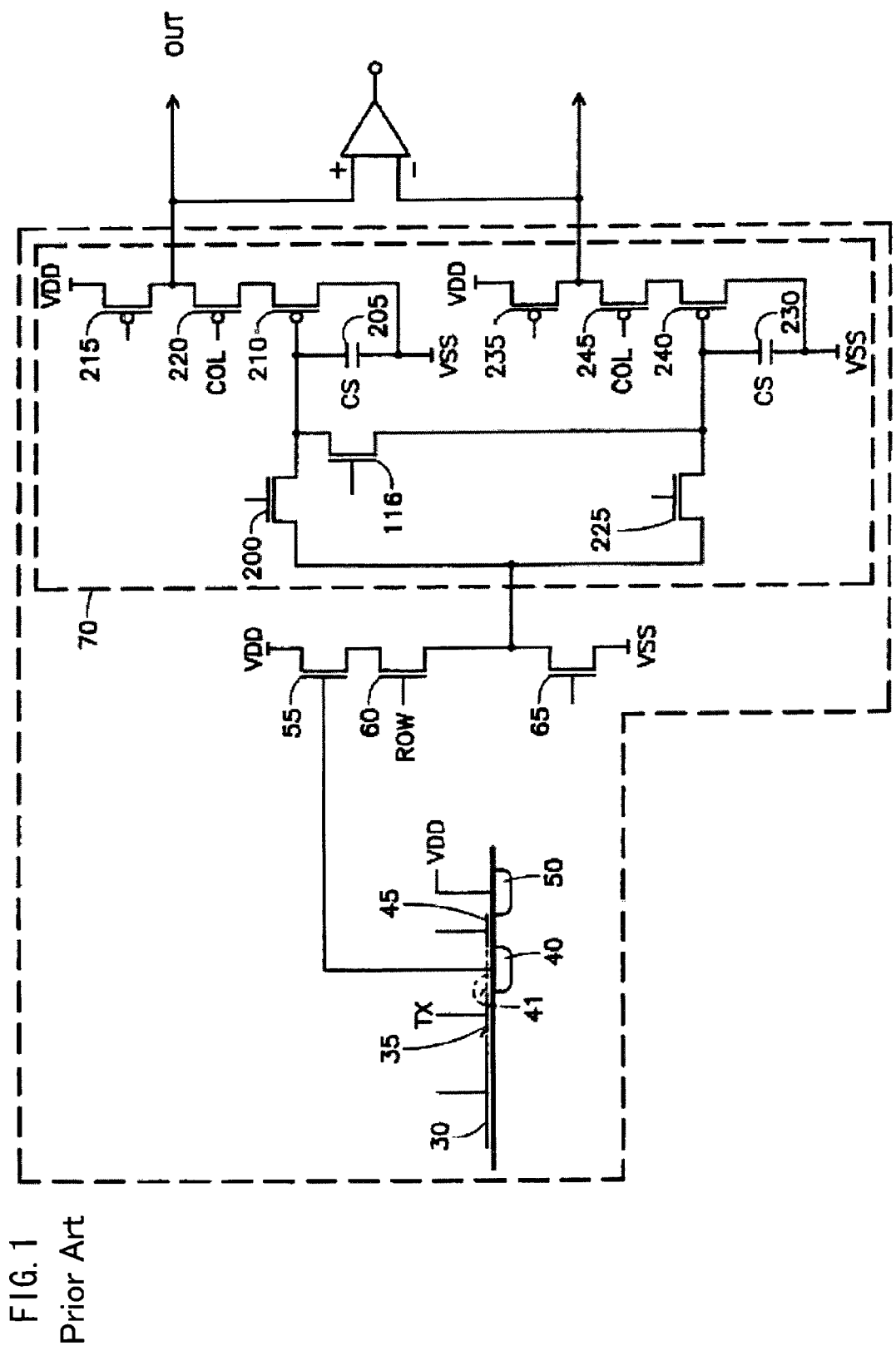
FIG. 1 is a schematic diagram of part of a known type of image sensor.
Figure 2:
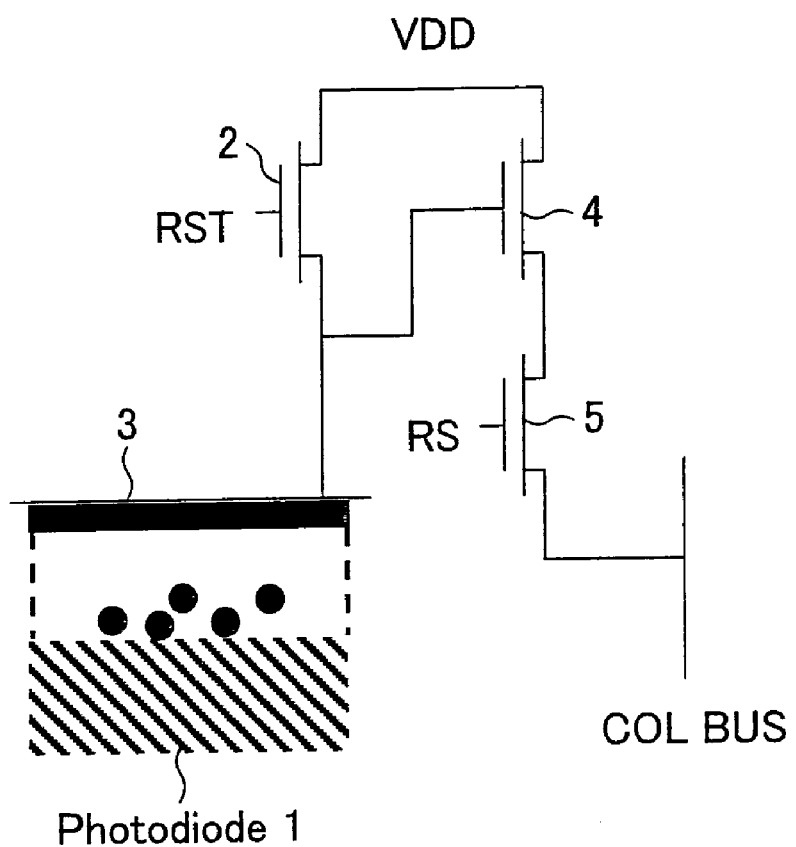
FIG. 2 is a circuit diagram of a known type of image sensing element.

The sensor element outputs may be supplied to one or more output terminals of the device by any suitable arrangement. For example, a reading-out arrangement of the type described hereinbefore with reference to FIG. 1 may be used.

Figure 3:
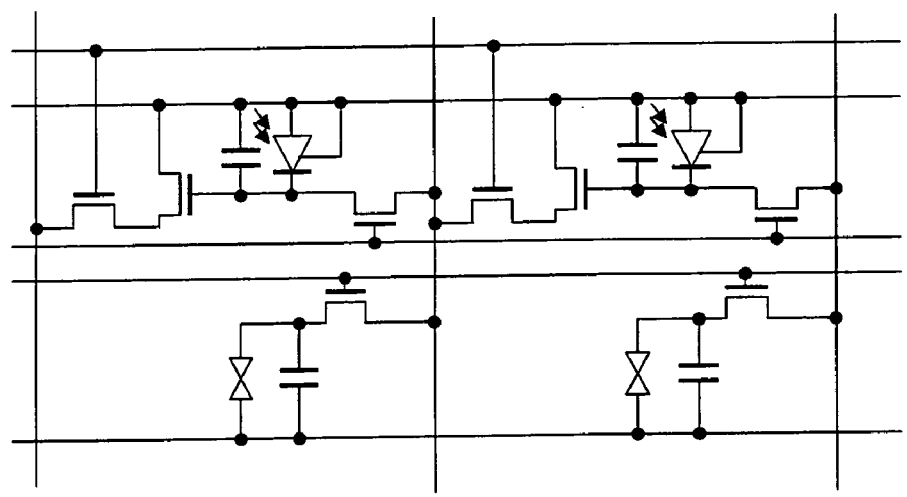
FIG. 3 is a circuit diagram of part of a known display incorporating an image sensor.

It is thus possible to provide a sensor element 10 which occupies a smaller area. For example, the known arrangement illustrated in FIG. 3 requires three transistors whereas the sensor element 10 of FIG. 5 requires only two transistors. For a given aperture ratio, more sensor elements 10 may therefore be provided in a given substrate area so that an image sensor of higher spatial resolution may be provided. Alternatively, a higher display aperture ratio may be achieved as compared, for example, with the arrangement of FIG. 3.

The range of output voltages provided by the sensor element of FIG. 5 may be reduced as compared with known arrangements because of the "parasitic" capacitance at the integrating node formed by the photodiode self-capacitance, the gate capacitance of the transistor M1 and the gate-source capacitance of the transistor M2. Also, variations in the parasitic capacitances of the sensor elements 10 forming the array and resulting from processing effects may result in an increase in image sensor fixed pattern noise. The sensor element of FIG. 5 is thus suitable for applications where these effects can be tolerated and is particularly suitable where improved image sensing spatial resolution and/or improved display aperture ratio are required.

Figure 7:
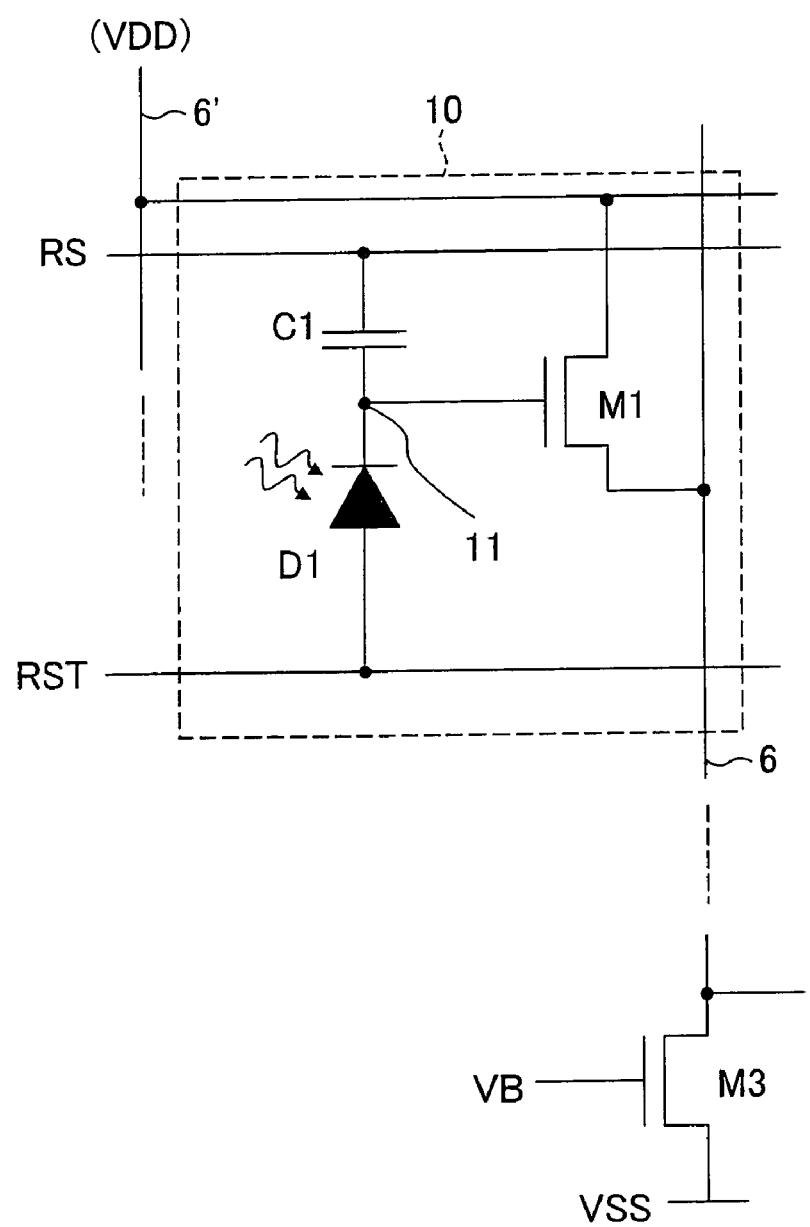
FIG. 7 is a circuit diagram of part of an image sensor for use in another embodiment of the invention.
Figure 8:
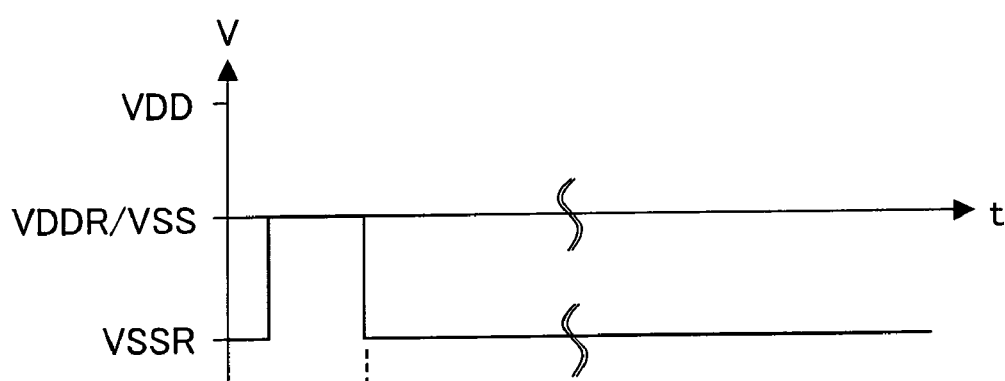
FIG. 8 is a timing diagram illustrating waveforms occurring in the sensor shown in FIG. 7.
Figure 8:
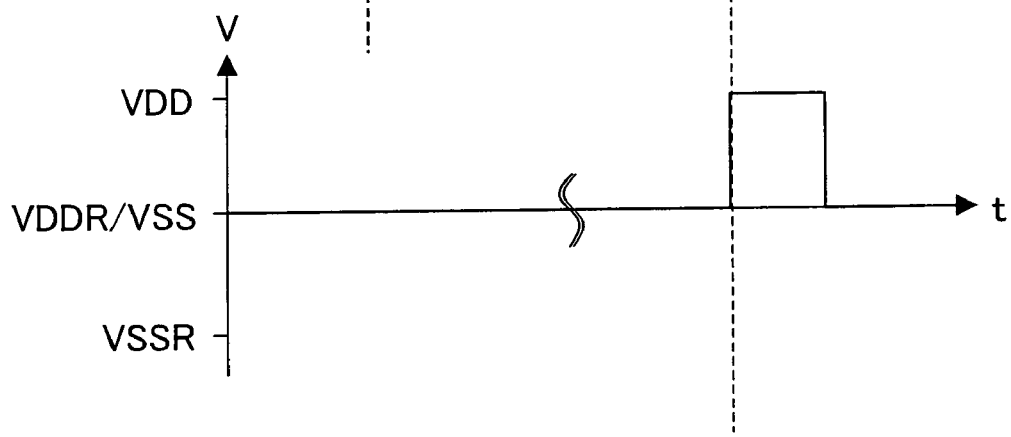

FIG. 7 illustrates a sensor element 10 of a combined image sensor and display device which requires only one transistor M1 and thus occupies an even smaller substrate area, permitting even greater image sensing spatial resolution and/or display aperture ratio. The transistor M1 and the transistor M3 are as described hereinbefore. The cathode of the photodiode D1 and the first electrode of the integrating capacitor C1 are connected to the integrating node 11 and to the gate of the transistor M1. The anode of the photodiode D1 is connected to the reset line RST and the transistor M2 is omitted. The second electrode of the capacitor C1 is connected to the row select line RS. The waveforms on the reset line RST and on the row select line RS are illustrated by the upper and lower waveforms shown in FIG. 8.

As described hereinbefore, the sensor elements perform a repeating cycle of resetting, integrating and reading phases. The cycles are synchronized with each other for the sensor elements 10 in the same row and the cycles for different rows are staggered or offset in time, for example in accordance with known active matrix addressing techniques.

At the start of the resetting phase, the signal on the reset line RST rises to its higher level of $V_{DDR}$. The photodiode D1 thus becomes forward-biased and conducts so as to charge the integrating node 11 to a potential of $(V_{DDR}-V_D)$, where $V_D$ is the forward voltage of the photodiode. The voltage $V_{DDR}$ is less than the threshold voltage of the transistor M1 so that this transistor remains switched off during the resetting phase and during the subsequent integrating phase.

The integrating phase begins when the resetting signal returns to its low value. During this phase, the photodiode current discharges the integrating capacitor C1 at a rate proportional to the photon flux incident on the photodiode. At the end of the integrating phase (when the row is selected for reading), the voltage $V_{INT}$ at the integrating node 11 is given by:

$$V_{INT}=V_{DDR}-V_D-I_{PHOTO} \cdot t_{INT}/C_T$$

where $V_D$ is the forward voltage of the photodiode D1 and the other variables are as defined hereinbefore. Again, the voltage at the gate of the transistor M1 falls further below the threshold voltage of the transistor M1, which therefore cannot accidentally turn on.

At the start of the reading phase, the row select signal on the line RS rises to its higher value and the column data line 6' receives the supply voltage VDD. Charge injection occurs across the integrating capacitor C1 such that the potential at the integrating node 11 is increased to:

$$V_{INT}=V_{DDR}-V_D-I_{PHOTO} \cdot t_{INT}/C_T+(V_{RS.H}-V_{RS.L}) \cdot C_{INT}/C_T$$

where the variables are as defined hereinbefore (except that the source-gate capacitance of the transistor M2 is no longer present in $C_T$). The potential at the integrating node 11 thus rises above the threshold voltage of the transistor M1 such that it operates, together with the transistor M3 at the end of the column, as a source-follower amplifier. The output voltage supplied to the column output represents the photodiode current integrated during the integrating phase and so represents the intensity of light, incident on the photodiode D1.

At the end of the reading phase, the row select signal on the line RS returns to its low value and the column data line is disconnected from the supply line VDD. Charge is removed from the integrating node 11 by charge injection across the capacitor C1. The potential of the integrating node 11 thus drops below the threshold voltage of the transistor M1, which is thus turned off.

As mentioned hereinbefore, the substrate area occupied by the sensor element 10 of FIG. 7 is even less than that of the previously described elements. Further, the parasitic capacitance at the integrating node 11 is less than that for the sensor element shown in FIG. 5 because the transistor M2 is omitted. The output signal range is therefore increased and fixed pattern noise is reduced as compared with the sensor element of FIG. 5.

The sensor element of FIG. 7 may be modified by reversing the polarity of the photodiode D1 such that its anode is connected to the integrating node 11 and its cathode is connected to the rest line RST. The signal on the reset line RST is then modified such that it has the lower value VSSR during the resetting phase and the higher value VDDR during the other phases. In this case, the potential at the integrating node 11 rises during the integration phase. The parameters of this arrangement are such that the potential at the integrating node 11 and hence at the gate of the transistor M1 remain below the threshold voltage of the transistor M1 during the integrating phase.

Figure 9:
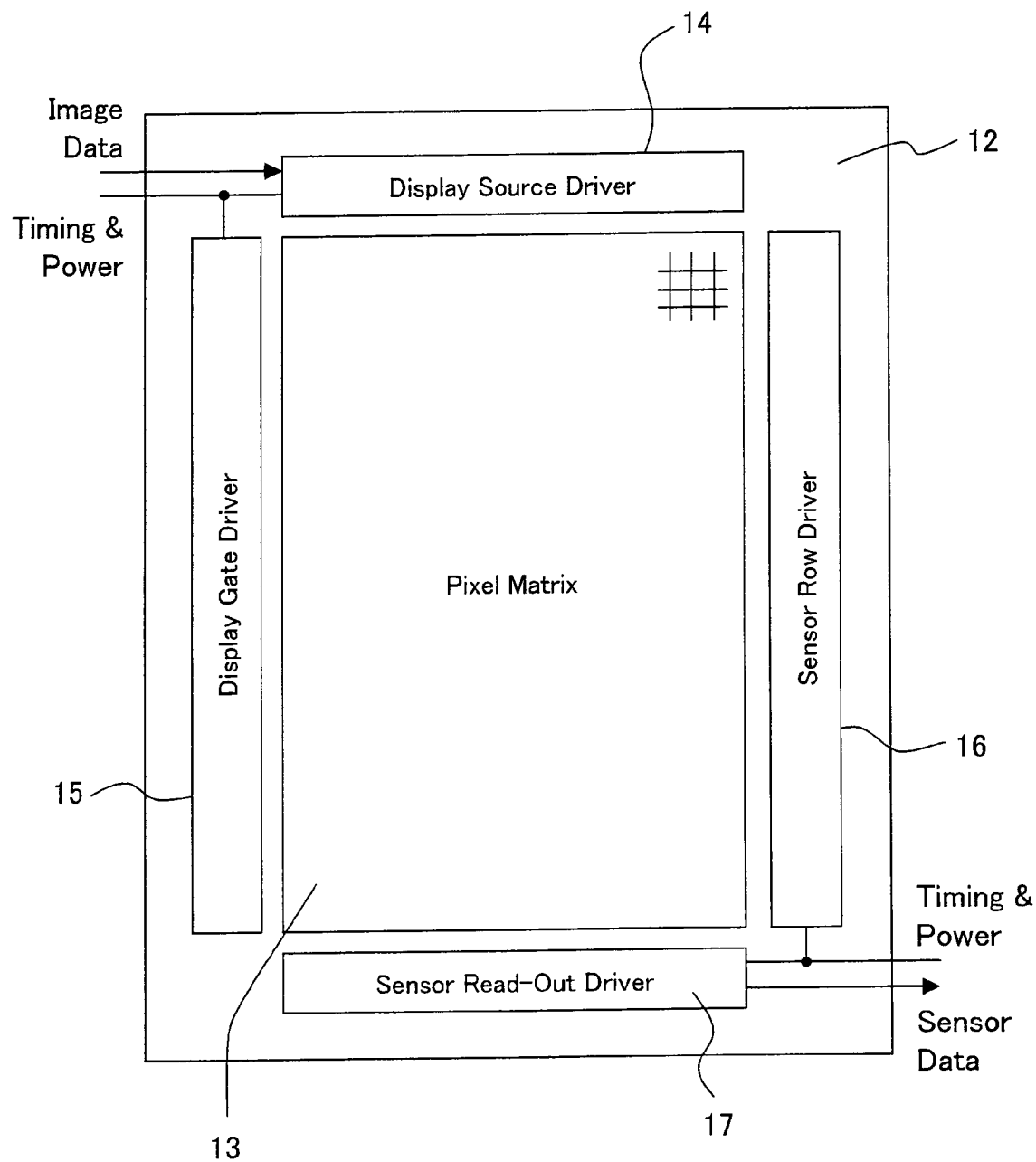
FIG. 9 is a schematic diagram illustrating a combined image sensor and display device constituting an embodiment of the invention.

As mentioned hereinbefore, the array of sensor elements 10 and the output circuitry at the bottom of the columns are incorporated within a device so as to provide a display with an input facility, for example in the form of a "touch screen". FIG. 9 illustrates the layout of such a device on a common substrate, on which all of the components are integrated, for example by thin-film technology or silicon-on-insulator technology. A transparent substrate 12, for example made of glass, carries a pixel matrix 13 comprising an array or matrix of display picture elements (pixels) including the sensor elements, together with appropriate electrodes extending in the row and column directions. The device receives image data together with timing signals and power from any suitable image source and comprises a display source driver 14 and a display gate driver 15. Such drivers are known in the field of active matrix devices and will not therefore be described further. The device also comprise a sensor row driver 16 and a sensor read-out driver 17. The drivers 16 and 17 receive timing and power signals from apparatus for processing the sensor data. The sensor read-out driver 17 may be of conventional type as described hereinbefore and the sensor row driver 16 may be similar to the display gate driver 15.

Figure 10:
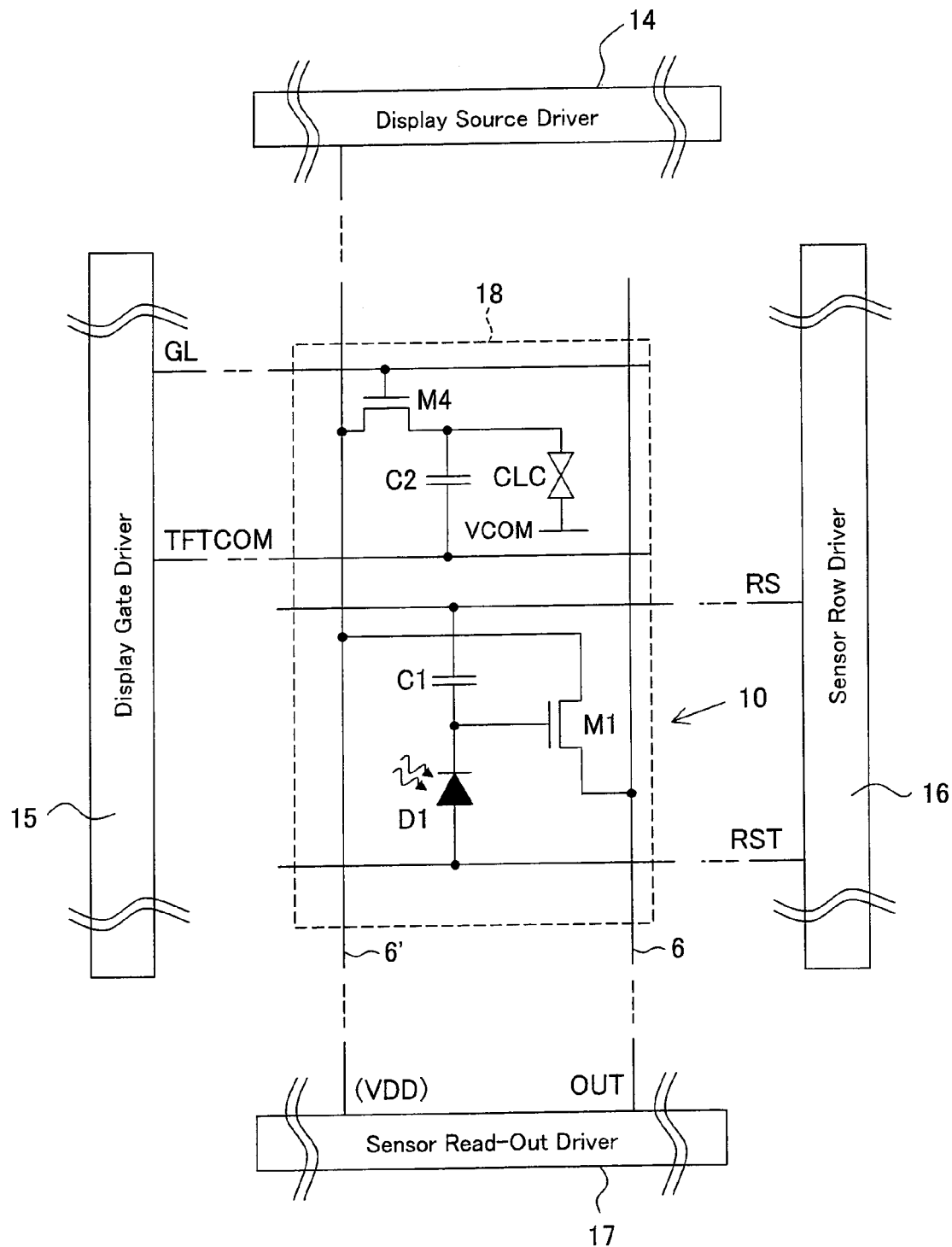
FIG. 10 is a diagram illustrating a detail of an example of the embodiment shown in FIG. 9.

FIG. 10 illustrates an example of the combined image sensor and display device of FIG. 9 in the form of an active matrix liquid crystal display (AMLCD) including the image sensing function. The circuit diagram of one of the device elements 18 forming the array is shown in detail. The display pixel is of known type and comprises a thin-film insulated gate field effect transistor M4 whose gate is connected via a row gate line GL to the display gate driver 15 and whose source is connected via the column data line 6' to the display source driver 14. The drain of the transistor M4 is connected to one electrode of a capacitor C2 and to an electrode of a liquid crystal pixel CLC. The other electrode of the capacitor C2 is connected via a common line TFTCOM to the driver 15. The other pixel electrode is constituted by a counter-electrode on the opposite device substrate connected to receive a common counter-electrode voltage VCOM.

The sensor element 10 is of the type illustrated in FIG. 7 and comprises the single transistor M1, the photodiode D1 and the integrating capacitor C1. The column data lines 6 and 6' are connected to the display source driver 14 and the sensor read-out driver 17. The row select line RS and the reset line RST are connected to the sensor row driver 16. For convenience, the source of the transistor M1 is shown connected to the column data line 6 belonging to the adjacent column of device elements, which comprise only display pixels and not sensor elements.

The operation of the image display pixels in such an AMLCD is well-known and will not be described further. The operation of the image sensor comprising the sensor elements 10 and the drivers 16 and 17 is as described hereinbefore. The addressing of the display pixels and the sensor elements is synchronized on a row-by-row basis and an example of the timing of such addressing is described hereinafter.

Figure 11:
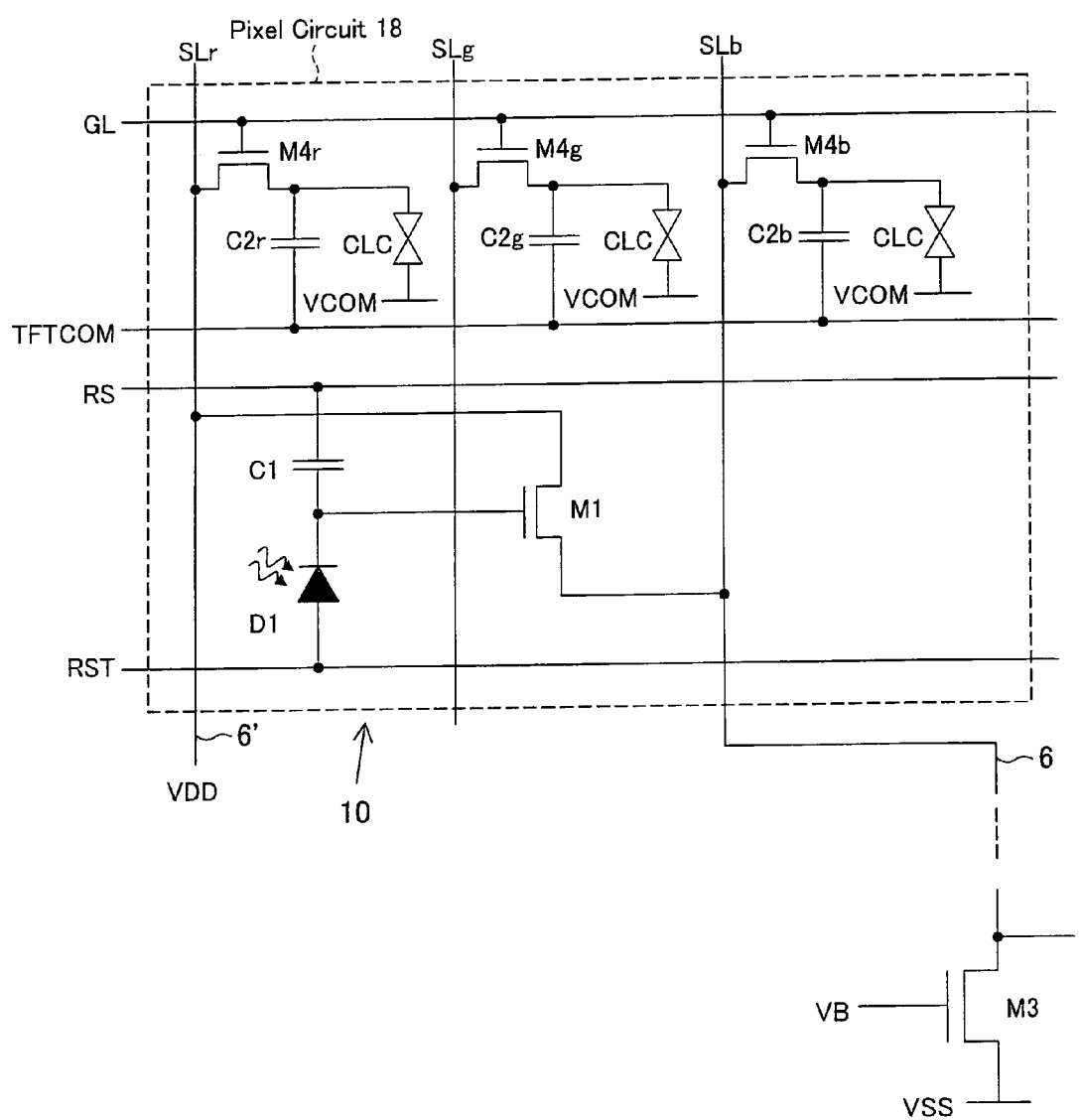
FIG. 11 is a diagram illustrating a detail of another example of the embodiment shown in FIG. 9.

FIG. 11 illustrates a device in which one sensor element 10 is provided for each set of three colour component pixels forming a composite full-colour pixel. Separate column data lines in the form of source lines SLr, SLg and SLb are provided for the RGB component pixels of each column of composite pixels and are connected to the display source driver 14. The source lines SLr and SLb also form the data lines 6' and 6, respectively, and are connected to the sensor read-out driver 17.

Figure 4:
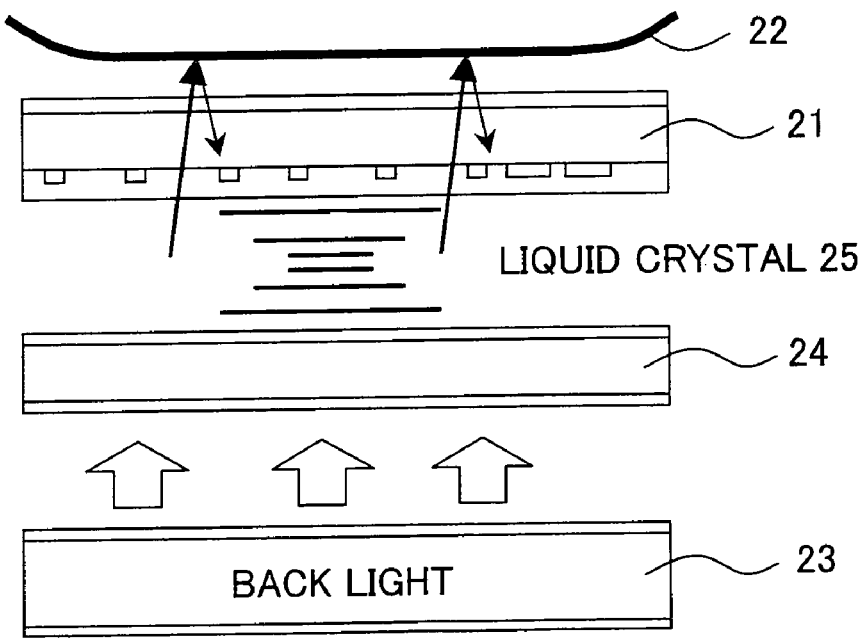
FIG. 4 is a schematic cross-sectional diagram of a known display including an image sensor operating in reflection mode.

The photodiode D1 and the integrating capacitor C1 are disposed within one of the colour component pixels, in this case the red pixel, whereas the transistor M1 is disposed within the green colour component pixel. This reduces the area occupied by the sensor element circuitry within each colour component pixel and thus increases the lowest pixel aperture ratio. Locating the photodiodes D1 under colour component pixels of one colour would make the image sensor sensitive to monochromatic light of that colour. This may be avoided by locating the photodiodes under different colour filter colours across the device or by operating the device with the active matrix substrate uppermost, for example as illustrated in FIG. 4. In the arrangement of FIG. 4, ambient light does not pass through the display colour filtering before being incident on the photodiodes.

Figure 12:
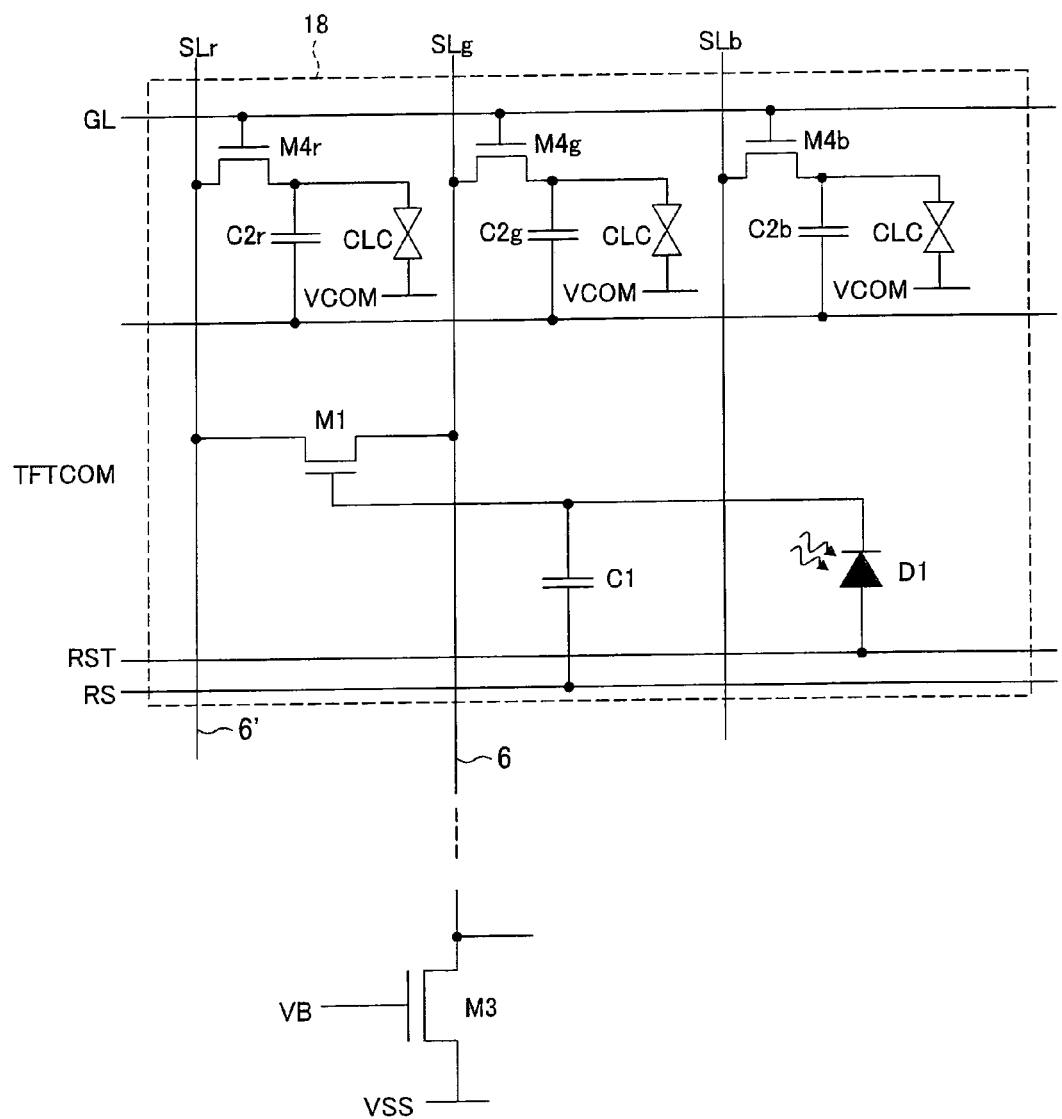
FIG. 12 is a diagram illustrating a detail of a further example of the embodiment shown in FIG. 9.

FIG. 12 illustrates a device which differs from that of FIG. 11 in that the sensor element is spread over three adjacent colour component pixels so as to increase even further the lowest pixel aperture ratio.

Figure 13:
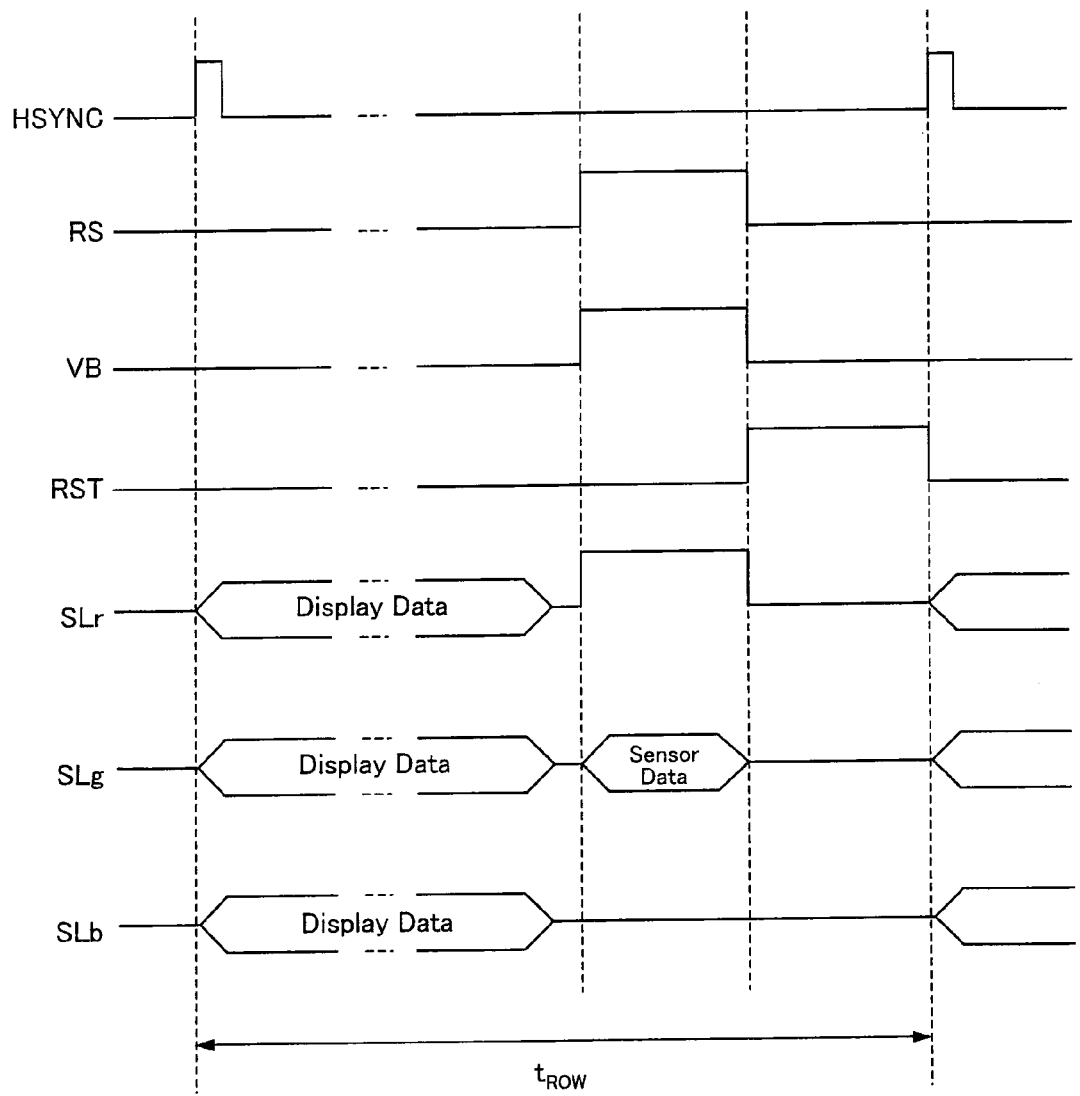
FIG. 13 is a timing diagram illustrating operation of the embodiment shown in FIG. 9.

Because of the sharing of the column data lines as pixel source lines and column output lines, it is necessary for addressing or scanning of the image display pixels and the sensor elements to be performed with the appropriate timing and an example of such timing is illustrated in the waveform diagram of FIG. 13. The reading phase of each sensor element row need only be performed for a relatively small portion of the total row addressing time of each row and this may be arranged to coincide with the horizontal blanking period of the display function, during which time the column data lines are disconnected from the display source driver 14.

As illustrated in FIG. 13, each display row period starts with a horizontal sync pulse HSYNC, after which the lines SLr, SLg and SLb are driven with suitable voltages in order to control the optical states of the colour component pixels of the selected row so as to refresh the image row-by-row as in known addressing schemes.

Following signal transfer to the image display pixels of the row, the column data lines are disconnected from the display source driver 14 at the start of the blanking period, which is commonly used in known AMLCDs to invert the polarity of the counter-electrode so as to prevent degradation of the liquid crystal material. During the blanking period, the sensor element row select signal rises on the line RS, the supply voltage $V_{DD}$ is applied to the column data lines 6', and the bias voltage VB is applied to the transistors M3 to which the column data lines 6 are connected so as to enable the source-follower arrangement in the sensor elements of the currently selected row. The sensor data are thus output via the column lines SLg, 6 to the sensor read-out driver 17, which acts as an interface between the sensor elements 10 and the sensor output of the device.

At the end of the reading phase of the selected row of sensor elements, the row select and bias signals return to their low potential and the supply voltage $V_{DD}$ is removed from the data lines 6'. A resetting signal is applied to the reset line RST for the sensor elements of the selected row so as to reset the integrating nodes to the predetermined voltage. The resetting signal is then removed at the end of the row addressing period tROW and the process is then repeated for the next pixel row.

The arrangements illustrated in FIGS. 11 and 12 give examples of spreading the sensor element components across a plurality of pixels to increase the lowest pixel aperture ratio and of sharing common lines to reduce the area occupied by the sensor element and thus increase the aperture ratio of the display. However, the components of the sensor elements may be arranged in any other suitable manner across the display pixels. Also, other common line sharing arrangements are possible.

Figure 14:
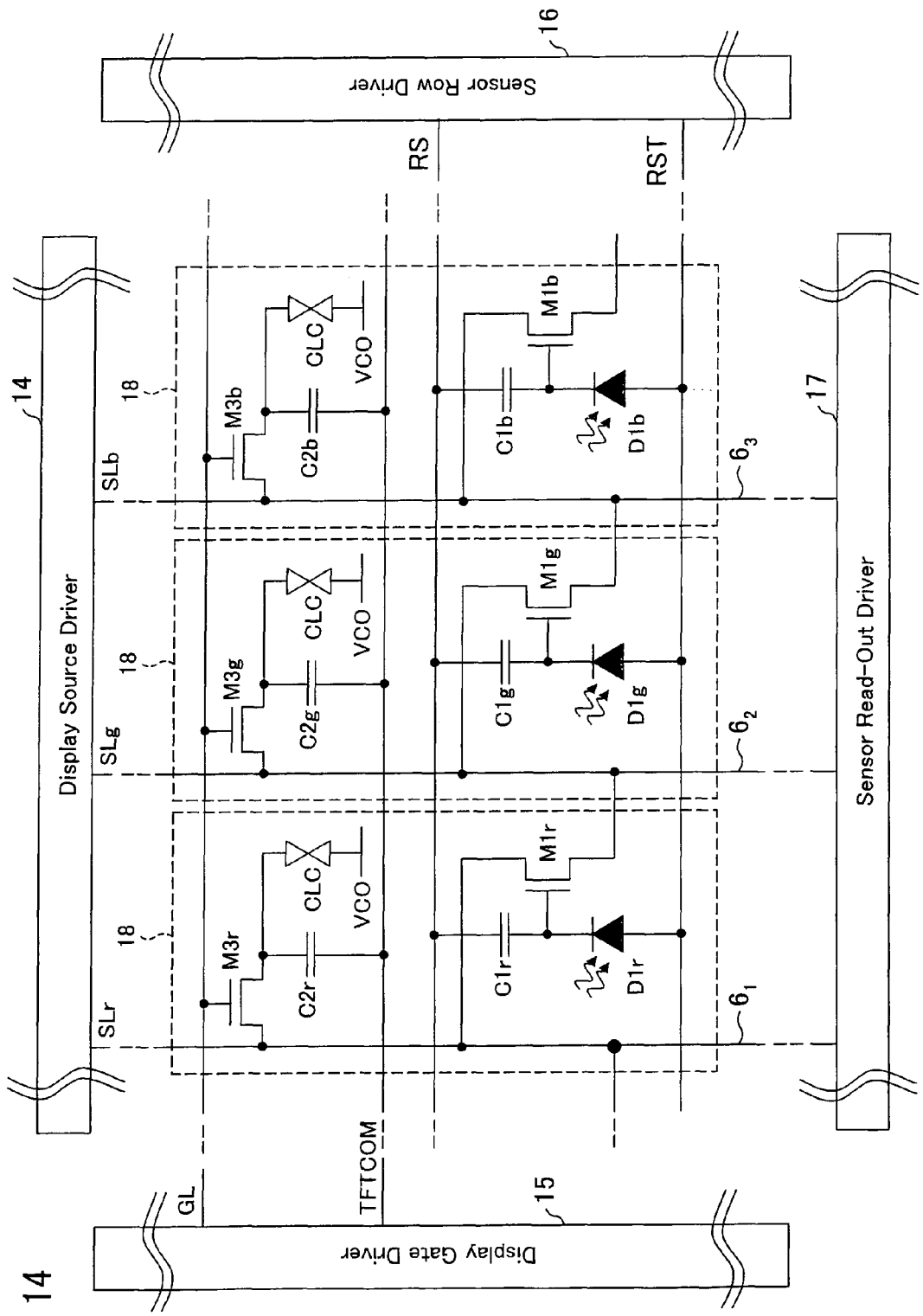
FIG. 14 is a diagram illustrating yet another example of the embodiment shown in FIG. 9.

FIG. 14 illustrates a device which differs from that shown in FIG. 10 in that a sensor element is provided within each of the device elements 18. FIG. 14 illustrates three adjacent colour component pixels in the same row with the components of the display pixels and sensor elements for the red, green and blue colour component pixel having the suffixes r, g and b, respectfully.

The source-drain paths of the transistors M1r, M1g and M1b are connected between adjacent pairs of column data lines $6_1$, $6_2$, and $6_3$, which also form the source lines SLr, SLg and SLb. For example, the transistor M1g has its source-drain path connected between the column data line $6_2$ for the column of device elements 18 to which it belongs and the adjacent column data line $6_3$ for the adjacent column.

During the reading phase of each row of sensor elements, alternate column data lines such as $6_1$ and $6_3$ are connected to the supply line VDD. The remaining column data lines such as $6_2$ are connected to biasing transistors (not shown in FIG. 14) in the sensor read-out driver 17. Thus, adjacent pairs of sensor elements share a common column data line such as $6_2$ so that the output of these sensor elements are summed. The output is therefore effectively the average of two sensor values so that output variations are reduced. Also, the time required to charge the column data line is reduced so that the reading phase may be made shorter.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The invention claimed is:

1. A combined image sensor and display device comprising a plurality of device elements arranged as an array of rows and columns, each of a first set of the device elements comprising a display pixel having a data input, the data inputs of each column being connected to a respective column data line, each of a second set of the device elements comprising an image sensor element comprising a photodetecting element, a semiconductor amplifying element, and an integrating capacitor having a first electrode, which is connected to a control electrode of the amplifying element and a first electrode of the photodetecting element, and a second electrode connected to a control input, which is arranged to receive, during a sensing phase, a first voltage for disabling the amplifying element and for permitting integration by the capacitor of a photocurrent from the photodetecting element and to receive, during a reading phase, a second voltage for enabling the amplifying element, each of the amplifying elements having a main conduction path connected to at least one of the column data lines, each of the amplifying elements having a control electrode threshold absolute voltage below which the amplifying element is disabled and the photocurrent being such that the absolute value of the voltage at the control electrode remains below the threshold absolute voltage during the sensing phase.

2. A device as claimed in claim 1, in which the polarity of the photocurrent is such as to reduce the absolute value of the voltage at the control electrode during the sensing phase.

3. A device as claimed in claim 1, in which the main conduction path of each of the amplifying elements is connected between a pair of the column data lines.

4. A device as claimed in claim 1, in which the first set comprises all of the device elements.

5. A device as claimed in claim 1, in which the second set comprises fewer than all of the device elements.

6. A device as claimed in claim 1, in which each of the senior elements is distributed across a respective group of the device elements.

7. A device as claimed in claim 1, in which the sensing and reading phases are repeated cyclically.

8. A device as claimed in claim 1, in which each of the photodetecting elements is a photodiode.

9. A device as claimed in claim 8, in which each of the photodiodes is a lateral photodiode.

10. A device as claimed in claim 8, in which each of the photodiodes is a thin film diode.

11. A device as claimed in claim 1, in which each of the amplifying elements comprises a voltage-follower arrangement.

12. A device as claimed in claim 1, in which each of the amplifying elements comprises a first transistor.

13. A device as claimed in claim 12, in which each of the first transistors is a thin film transistor.

14. A device as claimed in claim 12, in which each of the first transistors is a field effect transistor.

15. A device as claimed in claim 14, in which each of the first transistors is connected as a source-follower, the control electrode comprises the transistor gate and the main conduction path comprises the source-drain path.

16. A device as claimed in claim 1, in which each of the sensor elements comprises a semiconductor resetting element having a control electrode connected to a reset input and being arranged, during a resetting phase, to charge the capacitor to a predetermined voltage.

17. A device as claimed in claim 16, in which each of the resetting elements has a main conduction path connected between the first electrode of the capacitor and a predetermined voltage source.

18. A device as claimed in claim 16, in which each of the resetting elements comprises a second transistor.

19. A device as claimed in claim 18, in which each of the second transistors is a thin film transistor.

20. A device as claimed in claim 16, comprising row reset inputs, each of which is connected to the reset inputs of the sensor elements of a respective row.

21. A device as claimed in claim 1, comprising row control inputs, each of which is connected to the control inputs of the sensor elements of a respective row.

22. A device as claimed in claim 1, in which each of at least some of the column data lines is connected to a respective biasing element.

23. A device as claimed in claim 22, in which each biasing element comprises a third transistor.

24. A device as claimed in claim 23, in which each third transistor is a thin film transistor.

25. A device as claimed in claim 1, comprising an active matrix addressing arrangement.

26. A device as claimed in claim 25, in which active matrix addressing arrangement is arranged to address each row of the sensor elements during a line blanking period of a corresponding row of the display pixels.

27. A device as claimed in claim 1, in which the display pixels are liquid crystal pixels.

* * * * *